United States Patent
Lesea

(10) Patent No.: US 7,944,769 B1
(45) Date of Patent: May 17, 2011

(54) SYSTEM FOR POWER-ON DETECTION

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 41 days.

(21) Appl. No.: 12/579,274

(22) Filed: Oct. 14, 2009

(51) Int. Cl.
*G11C 5/14* (2006.01)

(52) U.S. Cl. .................. 365/226; 365/227; 365/228

(58) Field of Classification Search .......... 365/226, 365/227, 228
See application file for complete search history.

(56) References Cited

U.S. PATENT DOCUMENTS

| | | | | |
|---|---|---|---|---|
| 4,302,818 A * | 11/1981 | Niemann | ...................... | 708/520 |
| 5,017,803 A * | 5/1991 | Yoshida | ...................... | 327/546 |
| 5,894,446 A * | 4/1999 | Itou | ...................... | 365/222 |
| 6,134,686 A * | 10/2000 | Jha | ...................... | 714/724 |
| 6,768,354 B2 * | 7/2004 | Yamazaki et al. | ...................... | 327/143 |
| 7,116,603 B2 * | 10/2006 | Kanda et al. | ...................... | 365/225.7 |
| 7,191,352 B2 * | 3/2007 | Soroushi et al. | ...................... | 713/340 |
| 7,403,051 B1 | 7/2008 | Lesea | | |
| 7,417,908 B2 * | 8/2008 | Ogawa et al. | ...................... | 365/200 |
| 7,855,930 B2 * | 12/2010 | Chen | ...................... | 365/226 |

* cited by examiner

*Primary Examiner* — Viet Q Nguyen
(74) *Attorney, Agent, or Firm* — Kevin T. Cuenot

(57) ABSTRACT

A system for detecting power-on of a circuit block within an integrated circuit (IC). The system can include a latch including a latch output and an inverted latch output. The latch can be coupled to, and powered by, a power supply providing power to the circuit block within the IC. The system further can include an exclusive OR circuit. The exclusive OR circuit can include an input stage coupled to the latch output and the inverted latch output. The exclusive OR circuit generates an output signal indicating whether the circuit block is in a power-on state.

20 Claims, 3 Drawing Sheets

SYSTEM FOR POWER-ON DETECTION

FIELD OF THE INVENTION

One or more embodiments disclosed within this specification relate to integrated circuit devices (ICs). More particularly, one or more embodiments relate to a power-on detection system for an IC.

BACKGROUND

Functional circuit blocks that were previously manufactured as individual integrated circuit devices (ICs) presently can be implemented within a single IC. Functional circuit blocks within an IC often intercommunicate, exchanging information, either uni-directionally or bi-directionally, or communicate with external electrical systems. For example, a flash memory block can store and provide data describing an initial setup to another circuit block, such as a microprocessor core, within a same IC.

Each circuit block can be powered by a unique power supply. Each power supply can provide a unique voltage potential. Each circuit block may contain a different circuit architecture or share a same circuit architecture, but be implemented with differing device types and/or device sizes, as compared to each other circuit block. As a result of differing power supplies to, and differing circuits being implemented within, each circuit block within an IC, subsequent to powering on the IC, the time required for each circuit block to reach operability may differ. The differing time to operability, or "power-on time," for each circuit block determines when the circuit block can effectively communicate, i.e., successfully transmit or receive data.

As each circuit block within an IC may have a unique power-on time, each circuit block can begin to effectively communicate at a different time subsequent to the moment that power is supplied to the IC. In that case, a first circuit block within an IC may attempt to communicate with a second circuit block within the IC prior to the second circuit block being capable of effective communication. The different power-on times of the various circuit blocks within the IC can result in miscommunication between circuit blocks at start-up. Inter-circuit block miscommunication is not limited to powering on an IC from an off state. Inter-circuit block miscommunication also can occur subsequent to an interruption of power to a circuit block within the IC or a reduction of the voltage potential provided to a circuit block below a minimum required functional voltage potential.

SUMMARY

One or more embodiments disclosed within this specification relate to power-on detection for an integrated circuit device (IC). One embodiment of the present invention can include a system for detecting power-on of a circuit block within an IC. The system can include a latch including a latch output and an inverted latch output. The latch can be coupled to, and powered by, a power supply providing power to the circuit block within the IC. The system further can include an exclusive OR circuit. The exclusive OR circuit can include an input stage coupled to the latch output and the inverted latch output, wherein the exclusive OR circuit generates an output signal indicating whether the circuit block is in a power-on state.

Another embodiment of the present invention can include a system for detecting power-on of a circuit block within an IC. The system can include a static memory cell including a first inverter and a second inverter that are cross-coupled. The first inverter can include an output that is a memory cell output. The second inverter can include an output that is an inverted memory cell output. The memory cell can be coupled to, and powered by, a power supply provided to the circuit block within the IC. The system further can include an exclusive OR circuit including an input stage coupled to the memory cell output and the inverted memory cell output. The exclusive OR circuit can generate an output signal indicating whether the circuit block has achieved a power-on state.

Another embodiment of the present invention can include a system for monitoring for a power-on state within a circuit block within an IC. The system can include a static memory cell including a first inverter and a second inverter that are cross-coupled. The first inverter can include an output that is a memory cell output. The second inverter can include an output that is an inverted memory cell output. The memory cell can be selectively coupled to, and powered by, a power supply provided to the circuit block within the IC.

The system can include a disabling block, coupled to, and between, the static memory cell and the power supply. The disabling block can include an input that receives a control signal. The disabling block can selectively couple the static memory cell to the power supply thereby causing the static memory cell to enter a power down state or begin start-up responsive to the control signal. The system further can include an exclusive OR circuit including an input stage coupled to the memory cell output and the inverted memory cell output. The exclusive OR circuit can generate an output signal indicating whether the circuit block is in a power-on state.

DETAILED DESCRIPTION

Figure 1:
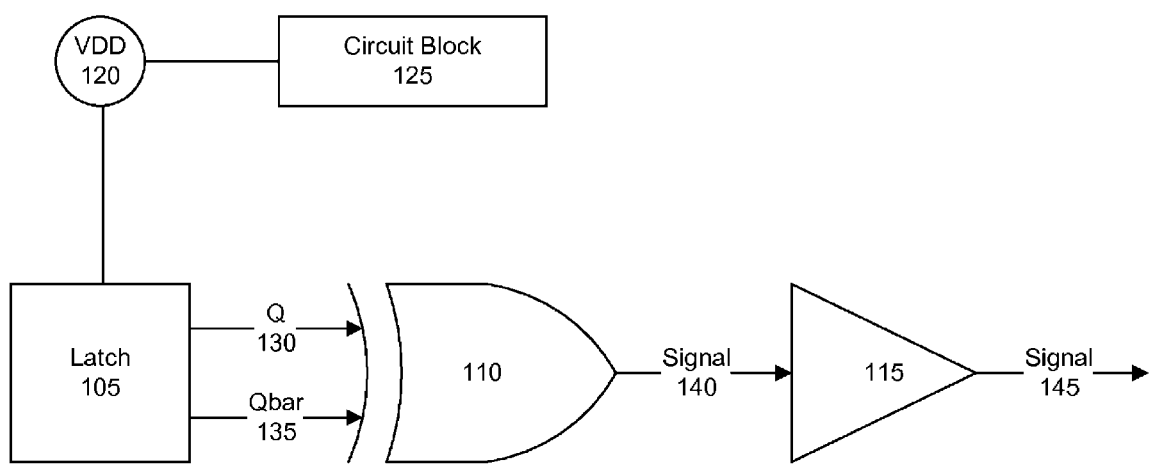
FIG. 1 is a first schematic diagram illustrating a power-on detection system in accordance with one embodiment of the present invention.

While the specification concludes with claims defining the features of the embodiments of the invention that are regarded as novel, it is believed that the inventive arrangements disclosed herein will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the embodiments of the invention in virtually any appropriately detailed structure. Further, the terms and phrases used herein are not intended to be limiting but rather to provide an understandable description of the embodiments of the invention.

One or more embodiments disclosed within this specification relate to power-on detection for an integrated circuit device (IC). More particularly, one or more embodiments can provide a system for determining when an electronic circuit achieves a power-on state while operating within the IC. In order to prevent miscommunication between circuit blocks at start-up, a power-on detection system can be implemented that detects when a power supply provided to a particular circuit block exceeds a minimum required voltage potential necessary for that circuit block to achieve a functional operating state subsequent to start-up or a power interruption. Upon determining that the power supply has reached the minimum required voltage potential, one or more embodiments disclosed herein determine that the circuit block being monitored is, or is likely to be, functionally operable. Accordingly, an indication can be provided to one or more other circuit blocks that communicate with the monitored circuit block indicating that the monitored circuit is functionally operable.

The power-on detection system can be implemented with a latch coupled to, and powered by, a power supply that provides power to the circuit block being monitored for the power-on state. As a voltage potential of the power supply coupled to the latch exceeds the minimum required voltage potential, a feedback loop within the latch achieves a gain greater than one, i.e., becomes a positive feedback loop. The positive feedback loop resolves the latch to one of two stable states. Each of the two stable states results in a voltage potential of each of the two output signals of the latch resolving with one output signal at a logic high and the other output signal at a logic low. When resolved, the static current consumption through the latch is limited to leakage current. An exclusive OR circuit coupled to the latch can detect the resolution of the latch and output an indication that the latch has resolved. The indication that the latch has resolved serves as a proxy also indicating that the monitored circuit block has achieved the power-on state. Once the latch resolves, the power-on detection system consumes negligible static power.

FIG. 1 is a first schematic diagram illustrating a power-on detection system (system) 100 within an IC in accordance with one embodiment of the present invention. In one aspect, system 100 can generate an indication that one or more circuit blocks within the IC have achieved a power-on state subsequent to startup of the IC. System 100 can include a latch 105, an exclusive OR 110, and a driver 115.

Latch 105 can be implemented with any of a variety of positive feedback based latch architectures that provide two output signals with a second of the two output signals being a logic inversion of a first of the two output signals. Additionally, latch 105 can be implemented with any positive feedback based latch architecture that begins operation in an undetermined state when power is initially applied and remains in an undetermined state until a desired voltage potential powering latch 105 is achieved. Subsequent to reaching the desired voltage potential, a positive feedback loop within latch 105 is enabled thereby causing latch 105 to resolve.

By their nature, positive feedback latches are multi-stable circuits having more than one stable operating point for a set of circuit operating conditions. In one embodiment, complimentary metal oxide semiconductor (CMOS) latches can be used. It should be appreciated, however, that latch 105 can be implemented with any of a variety of alternative latch structures that are based upon positive feedback. For example, bipolar emitter coupled logic can be used. As such, the use of CMOS technology to implement latch 105 is not intended to limit the embodiments described within this specification.

When the voltage potential provided to latch 105 by a power supply VDD 120 is sufficient to enable a positive feedback loop within latch 105, a small perturbation of the positive feedback loop can resolve the voltage potential at the two output nodes of latch 105 to opposing logic levels. Within this specification, the term "resolve" or "a resolved state," refers a state in which sufficient voltage potential is provided by a power supply, or power source, powering a positive feedback latch to enable a positive feedback loop within the latch that forces the latch to a stable state. In the stable state, a voltage potential at each of two output nodes of the latch is stable at opposing ends of a voltage potential range corresponding to the power supply powering the latch. Each of the two outputs of latch 105 is coupled to an input of exclusive OR 110. Latch 105 provides signals Q 130 and Qbar 135 as output signals, with signal Q bar 135 being a logic inversion of signal Q 130. Within this specification, the same reference characters are used to refer to terminals, signal lines, wires, and their corresponding signals. In this regard, the terms "signal," "wire," "connection," "terminal," "node," and "pin" may be used interchangeably, from time-to-time, within the this specification. Further, when a circuit component is said to have an input or an output, the input or output, as the case may be, refers to a node of the circuit or component.

Exclusive OR 110 can include two input nodes and an output node. Each input of exclusive OR 110 can be coupled to one of the two outputs of latch 105 to receive signals Q 130 and Qbar 135 as input signals. The output node of exclusive OR 110 can generate signal 140. Exclusive OR 110 can be implemented with any of a variety of circuit architectures capable of implementing an exclusive OR logic function. In one embodiment, exclusive OR 110 can be implemented with digital logic gates that, when fully switched, do not consume static power. Exclusive OR 110 can include a plurality of logic gates coupled together to implement the exclusive OR logic function. Exclusive OR 110 can operate as a two input exclusive OR logic gate, where the input of a logic high to one input of exclusive OR 110 and a simultaneous input of a logic low to the other input of exclusive OR 110 results in an output of a logic high from exclusive OR 110. Thus, signal 140 is at a logic high when one, and only one, of either of signals Q 130 and Qbar 135 is at a logic high. All other combinations of signal values for signals Q 130 and Qbar 135 received by exclusive OR 110 result in signal 140 being at a logic low. The output of exclusive OR 110 is coupled an input of driver 115.

Although embodiments within this specification are described in terms of positive polarity logic, negative polarity logic can be used to implement the structures described within this specification. As such, the use of positive polarity logic within this specification is for purposes of illustration only and is not intended as a limitation. As used within this specification, the phrases "positive polarity logic" and/or "positive logic," refer to implementing a logic high with a highest of two possible voltage potentials and a logic low with a lowest of two possible voltage potentials. The phrases "negative polarity logic" and/or "negative logic," refer to implementing a logic high with the lowest of two possible voltage potentials and a logic low with a highest of two possible voltage potentials.

Driver 115 can include an input node and an output node. The input node of driver 115 can be coupled to the output node of exclusive OR 110 and receive signal 140. Driver 115 can be coupled to a load (not shown). The output node of driver 115 can generate signal 145. Driver 115 can be implemented with any of a variety of unity gain driver circuits such as, for example, a digital CMOS inverter pair. In addition, although illustrated in FIG. 1 with a single stage, driver 115 can be implemented with two or more stages and, as such, is not intended as a limitation of the embodiments described within this specification.

For example, two or more driver stages can be implemented and coupled between exclusive OR 110 and a load impedance (not shown) driven by driver 115. Each successive driver stage within driver 115 can increase in size and drive capacity in a manner that optimizes a signal path time delay through driver 115. Driver 115 can be implemented to provide a positive, negative, or unity gain, depending upon the polarity and form desired for signal 145. Driver 115 can be implemented as any of a variety of circuits capable of receiving a single ended signal, such as signal 140, and increasing the drive capability of that signal to generate signal 145. Driver 115 can output signal 145 to other circuit blocks (not shown) within the IC in which system 100 is implemented.

In operation, latch 105 and circuit block 125, a circuit block to be monitored by power-on detection system 100, can begin in a powered down state where the voltage potential of VDD 120 is approximately equal to zero. As used within this specification, the phrases "power down" and/or "power down state," refer to a stable state in which an electronic circuit comprising one or more devices is decoupled from all sources of power and all nodes within the electronic circuit are discharged to a lowest available voltage potential. The phrases "power-on" and/or "power-on state," refer to a state in which a voltage potential of a power supply providing power to an electronic circuit is sufficient to render the electronic circuit operable for an intended function of the electronic circuit. Further, the phrase "start-up," refers to a period of time beginning at the moment power is supplied to an electronic circuit that is initially in a power down state, and ending with the electronic circuit reaching the power-on state.

For clarity, the embodiments described within this specification are powered with a positive voltage potential, i.e., VDD 120, and ground. However, it should be noted that latch 105 can be powered by any two differing voltage potentials capable of resolving latch 105. As such, the use of VDD 120 as a voltage source is for descriptive purposes only, and is not intended to limit the disclosed embodiments. For example, latch 105 can be powered by ground and a power supply providing a negative voltage potential, or a power supply providing a positive voltage potential and a power supply providing a negative voltage potential.

As power is restored to latch 105, the voltage potential of VDD 120, i.e., the voltage appearing across latch 105, begins increasing. Initially, insufficient voltage potential appears across the devices within latch 105 to enable the positive feedback loop within latch 105. As a result of the feedback loop being disabled, latch 105 remains unresolved with signals Q 130 and Qbar 135 each being at approximately one-half the voltage potential of VDD 120. As the voltage potential of VDD 120 increases, signals Q 130 and Qbar 135 can continue to increase proportionally with the voltage potential of VDD 120.

Latch 105 has three operating states. One of the three states is a metastable state in which the voltage potentials of signals Q 130 and Qbar 135 are approximately equal with each having a voltage potential approximately equal to one-half of the voltage potential of VDD 120. As the voltage potential of VDD 120 increases, however, the positive feedback loop within latch 105 can become enabled. When latch 105 is in the metastable state and the positive feedback loop within latch 105 becomes enabled, any perturbation to the feedback loop, such as, for example, noise at an output node, results in latch 105 resolving to one of two stable states.

In the two stable states of latch 105, the positive feedback loop within latch 105 resolves the outputs of latch 105 to either a state where the voltage potential of signal Q 130 is approximately equal to VDD 120 and the voltage potential of signal Qbar 135 is approximately equal to ground, or a state where the voltage potential of signal Q 130 is approximately equal to ground and the voltage potential of signal Qbar 135 is approximately equal to VDD 120. Once latch 105 is resolved to one of the two stable states, the positive feedback loop within latch 105 reinforces that stable state making latch 105 resistant to further perturbations seeking to alter the signals Q 130 and Qbar 135.

The devices used to implement latch 105 can be chosen such that latch 105 resolves upon the voltage potential of VDD 120 reaching a voltage potential sufficient for circuit block 125 to enter a power-on state. The type and size of CMOS devices used to implement latch 105 can be chosen via an iterative design process, whether via design simulation or physical circuit implementation, until latch 105 resolves at a desired voltage potential of VDD 120. The desired voltage potential of VDD 120 is a voltage potential that assures circuit block 125 has achieved the power-on state.

For example, computer simulations using process corner and temperature models can be performed on power-on detection system 100. Devices within latch 105 can be varied after iterative simulation runs until the devices within latch 105 are optimized to resolve latch 105 at the desired voltage potential of VDD 120. As known in the art, process corner models allow the simulation of an electronic circuit, manufactured within a particular IC manufacturing process, with device models that capture the effects of manufacturing variations within the particular IC manufacturing process that may affect electronic circuit performance. In a similar manner, temperature models capture the effects of temperature change upon electronic circuit performance.

In either of the two stable states of latch 105, one of signals Q 130 and Qbar 135 is at a logic high and the other signal is at a logic low. As such, when resolved, latch 105 outputs either a high-low or low-high signal pair for signals Q 130 and Qbar 135. The resolution of latch 105 to either of the two stable states can be an indicator that circuit block 125 is in a power-on state. In addition, when latch 105 resolves to one of the stable states, the current through latch 105 is limited to leakage current. As such, latch 105 provides a power efficient, power-on detector that consumes negligible static power.

As either of the two logic pairs, high-low or a low-high, occurring upon signals Q 130 and Qbar 135 indicates that latch 105 has resolved to a stable state, exclusive OR 110 can be used to generate signal 140 indicating when latch 105 resolves to the stable state. The presence of either of the high-low or low-high logic pairs upon signals Q 130 and Qbar 135 can result in signal 140 transitioning from a logic low to a logic high. The transition of signal 140 from a logic low to a logic high indicates latch 105 is resolved to a stable state.

The transition of signal 140 from a logic low to a logic high, when received by driver 115, results in the transition of signal 145 from a logic low to a logic high. Signal 145 can be monitored by circuit blocks within the IC other than system 100. When high, signal 145 indicates to those circuit blocks that circuit block 125 is in a power-on state and, thereby operable. In this manner, circuit blocks other than system 100 can postpone communicating with circuit block 125 until signal 145 transitions to a logic high, thereby indicating circuit block 125 is operable. As noted, when signals 140 and 145 transition to a logic high, circuit block 125 is presumed to have sufficient voltage for operation from VDD 120 and achieved the power-on state.

Figure 2:
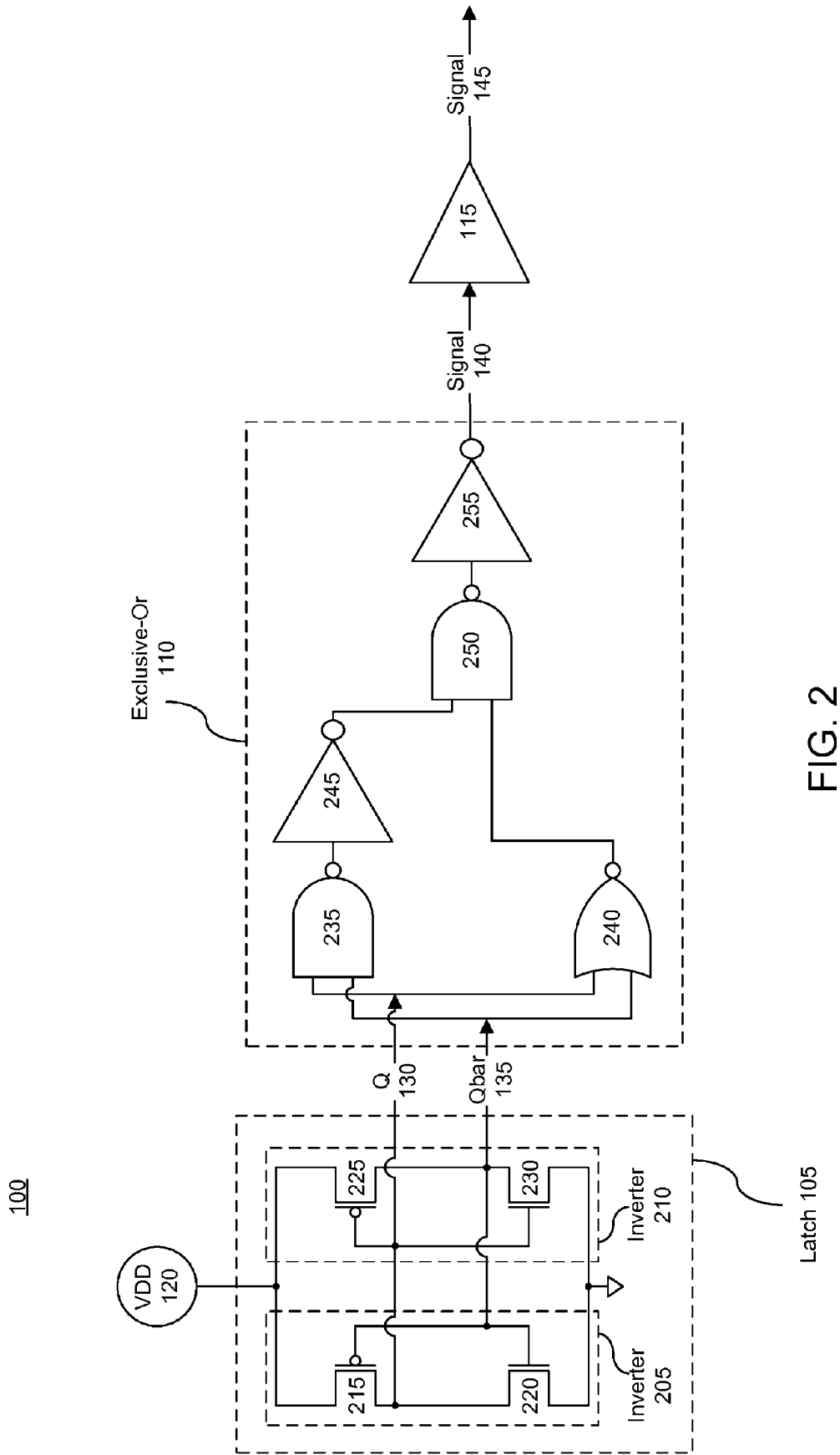
FIG. 2 is a second schematic diagram illustrating a power-on detection system in accordance with another embodiment of the present invention.

FIG. 2 is a second schematic diagram illustrating the power-on detection system 100 of FIG. 1 in accordance with another embodiment of the present invention. FIG. 2 illustrates a more detailed embodiment of power-on detection system 100. As such, like numbers will be used to refer to the same items throughout this specification.

As embodied in FIG. 2, latch 105 is implemented as a static memory cell. Implemented as a static memory cell, latch 105 includes inverter 205 and inverter 210. Within latch 105, inverters 205 and 210 are cross-coupled. Each of inverters 205 and 210 also is coupled to power supply VDD 120. As used within this specification, the term "cross-coupled," refers to a pair of electronic circuits coupled together such that an input of the first circuit is coupled to an output of the second circuit and an input of the second circuit is coupled to an output of the first circuit. Cross-coupling creates a positive feedback loop within the circuit pair.

For example, referring to FIG. 2, within latch 105, the output node of inverter 205 is a coupling point between the drain terminals of CMOS devices 215 and 220. The input node of inverter 205 is a coupling point between gate terminals of CMOS devices 215 and 220. The output node of inverter 210 is a coupling point between the drain terminals of CMOS devices 225 and 230. The input node of inverter 210 is a coupling point between gate terminals of CMOS devices 225 and 230.

Within latch 105, the output node of inverter 205 is coupled to the input node of inverter 210. Similarly, the output node of inverter 210 is coupled to the input node of inverter 205. As such, inverters 205 and 210 are cross-coupled to create a positive feedback loop within latch 105. The gain of the feedback loop created by inverters 205 and 210 is positive as a result of inverter 205 creating a negative gain within the feedback loop and inverter 210 returning the feedback loop to a positive gain.

Exclusive OR 110 can include NAND gate 235, NOR gate 240, inverter gate 245, NAND gate 250, and inverter gate 255 (hereafter "gates" 235-255). It should be appreciated that the implementation of exclusive OR 110 illustrated in FIG. 2 is for purposes of illustration only and that any of a variety of different exclusive OR gate configurations or architectures can be used. Gates 235-255 implement an exclusive OR function that is used by system 100 to monitor for the resolution of latch 105 to a stable state. The input devices of gates 235 and 240 implement the two inputs of exclusive OR 110. Each input node of exclusive OR 110 is coupled to one of the two output nodes of latch 105 and receives either signal Q 130 or signal Qbar 135. Gate 255 of exclusive OR 110 generates signal 140 as an output for exclusive OR 110. Exclusive OR 110 is coupled to, and outputs signal 140 to, driver 115.

In operation, at initiation of startup, the voltage potential of VDD 120 is approximately equal to zero and the voltage potential at each node within latch 105 is approximately equal to ground. As VDD 120 increases in voltage potential, latch 105 begins in a metastable state and the feedback loop through cross-coupled inverters 205 and 210 has a gain less than one. With latch 105 in the metastable state, signals Q 130 and Qbar 135, generated at the output node of inverters 205 and 210 respectively, are approximately equal to one half the voltage potential of VDD 120.

When one half the voltage potential of VDD 120 increases to a voltage potential greater than a threshold voltage, denoted as Vth, of one of CMOS devices 215, 220, 225, or 230 within latch 105, that CMOS device can be enabled, or "turned on." The enabled device can begin sourcing or sinking current. As differing CMOS devices can have differing threshold voltages, each of CMOS devices 215-230 can be enabled at differing voltage potentials of VDD 120. For example, Vth is typically different for N-type metal oxide field effect transistors (NMOS) and P-type metal oxide field effect transistors (PMOS) manufactured within a same manufacturing process. In that case, CMOS device 215, being a PMOS device, can have a different value of Vth than CMOS device 220, which is an NMOS device. Accordingly, CMOS device 215 can be enabled at a different voltage potential of VDD 120 than CMOS device 220.

In addition, in order for one of CMOS devices 215-230 to operate as an amplifier, and, as such, generate gain within the feedback loop of latch 105, the drain terminal to source terminal voltage potential, denoted as Vds, of that CMOS device must be greater than Vgs−Vth. A CMOS device with Vds greater than the difference (Vgs−Vth) is defined as being in saturation, or active, mode. In saturation mode, the CMOS device is capable of generating gain. When at least one CMOS device in each of inverters 205 and 210 achieves saturation mode, resulting in signal gain greater than unity though the CMOS device, a positive feedback loop becomes operable within latch 105. With the positive feedback loop operating within latch 105, any perturbation at a node within the positive feedback loop will drive latch 105 out of the meta-stable state. Additionally, the positive feedback within latch 105 forces one of signals Q 130 and Qbar 135 to a logic high and the other of signals Q 130 and Qbar 135 to a logic low.

For example, referring to FIG. 2, latch 105 can be powered on with the voltage potential of VDD 120 beginning at approximately zero volts. As the voltage potential of VDD 120 increases, the voltage potential of signals Q 130 and Qbar 135, being equal to one half the voltage potential of VDD 120, also increases. For purposes of illustration, it can be assumed that each of CMOS devices 215-230 has a same approximate value of Vth. As VDD 120 increases to a voltage potential at which one half the voltage potential of VDD 120 exceeds Vth of CMOS devices 215-230, each of CMOS devices 215-230 enters saturation mode. Each of CMOS devices 215-230 achieves saturation mode as Vgs for each of CMOS devices 215-230 is greater than Vth. Additionally, Vds for each of CMOS devices 215-230 is approximately equal to one-half the voltage potential of VDD 120, i.e., Vds for each of CMOS devices 215-230 is equal to either the voltage potential of signal Q 130 or the voltage potential of signal Qbar 135. Accordingly, Vds is assured to be greater than (Vgs−Vth) as Vgs also is approximately equal to one half the voltage potential of VDD 120.

With each of CMOS devices 215-230 in saturation mode, a positive feedback loop is created within latch 105. To further illustrate the example, assume a perturbation occurs in signal Q 130 that decreases the voltage potential of signal Q 130 to a value less than one half the voltage potential of VDD 120. The perturbation of signal Q 130 increases Vgs for CMOS device 225, thereby increasing current flow through CMOS device 225. The perturbation of signal Q 130 decreases Vgs for CMOS device 230, thereby decreasing current flow through device 230. As current through CMOS device 225 increases and current flow through CMOS device 230 decreases, the voltage potential of signal Qbar 135 is driven toward the voltage potential of VDD 120.

With signal Qbar 135 being greater than one half the voltage potential of VDD 120, Vgs for CMOS device 220 is greater than Vgs for CMOS device 215. As such, current flow though CMOS device 220 is greater than current flow through CMOS device 215, thereby driving the voltage potential of signal Q 130 toward ground. This positive feedback process continues until signals Q 130 and Qbar 135 resolve, e.g., reach steady state at approximately ground and the voltage potential of VDD 120, respectively. Additionally, the positive feedback loop of latch 105 reinforces the resolved state of latch 105 even as the voltage potential of VDD 120 decreases. In either resolved state of latch 105, no direct current path exists from VDD 120 to ground through either of inverters 205 and 210. As a result, the current consumption by latch 105 is near zero with current through latch 105 limited to leakage current through CMOS devices 215-230.

In one embodiment, the input devices of gates 235 and 240 can be implemented with CMOS devices having threshold voltages less than the threshold voltages of CMOS devices 215-230. As the resolution of latch 105 occurs during startup when one-half the voltage potential of VDD 120 exceeds Vth of CMOS devices 215-230, assuring the threshold voltages of the input devices of gates 235 and 240 are less than the threshold voltages of CMOS devices 215-230 assures exclusive OR 110 is operable prior to latch 105 resolving. With exclusive OR 110 being operable prior to latch 105 resolving, exclusive OR 110 can achieve a stable logic state prior to latch 105 resolving and output a change of logic state subsequent to latch 105 resolving. As such, signal 140 can display a stable and clear indication that the circuit block being monitored by power-on detection system 100 is not yet in a power-on state prior to latch 105 resolving. Accordingly, subsequent to latch 105 resolving and signal 140 changing state, a more robust indication that the monitored circuit block has changed from not yet being in a power-on state to being in a power-on state can be generated by power-on detection system 100.

Conventional power-on detection circuits compare a reference voltage to a supply voltage to be monitored for power-on and indicate a power-on state when the supply voltage exceeds the reference voltage. Typically, the reference voltage within conventional power-on detection circuits is implemented with a voltage reference, e.g. a bandgap voltage reference, or a resistor chain coupled between two voltage potentials. These reference voltage generating structures often consume milliamps of current. As latch 105, exclusive OR 110, and driver 115 of system 100 are implemented with static logic, the current flow through system 100 is limited to leakage current flowing through devices within latch 105, exclusive OR 110, and driver 115 when resolved. As a result, subsequent to latch 105 resolving, the static current consumption by system 100 can be measured in µAs as opposed to the milliamps of static current consumed by conventional power-on detection circuits. System 100 can provide power-on detection while greatly reducing static power consumption when compared to the power consumption of conventional power-on detection circuits.

Figure 3:
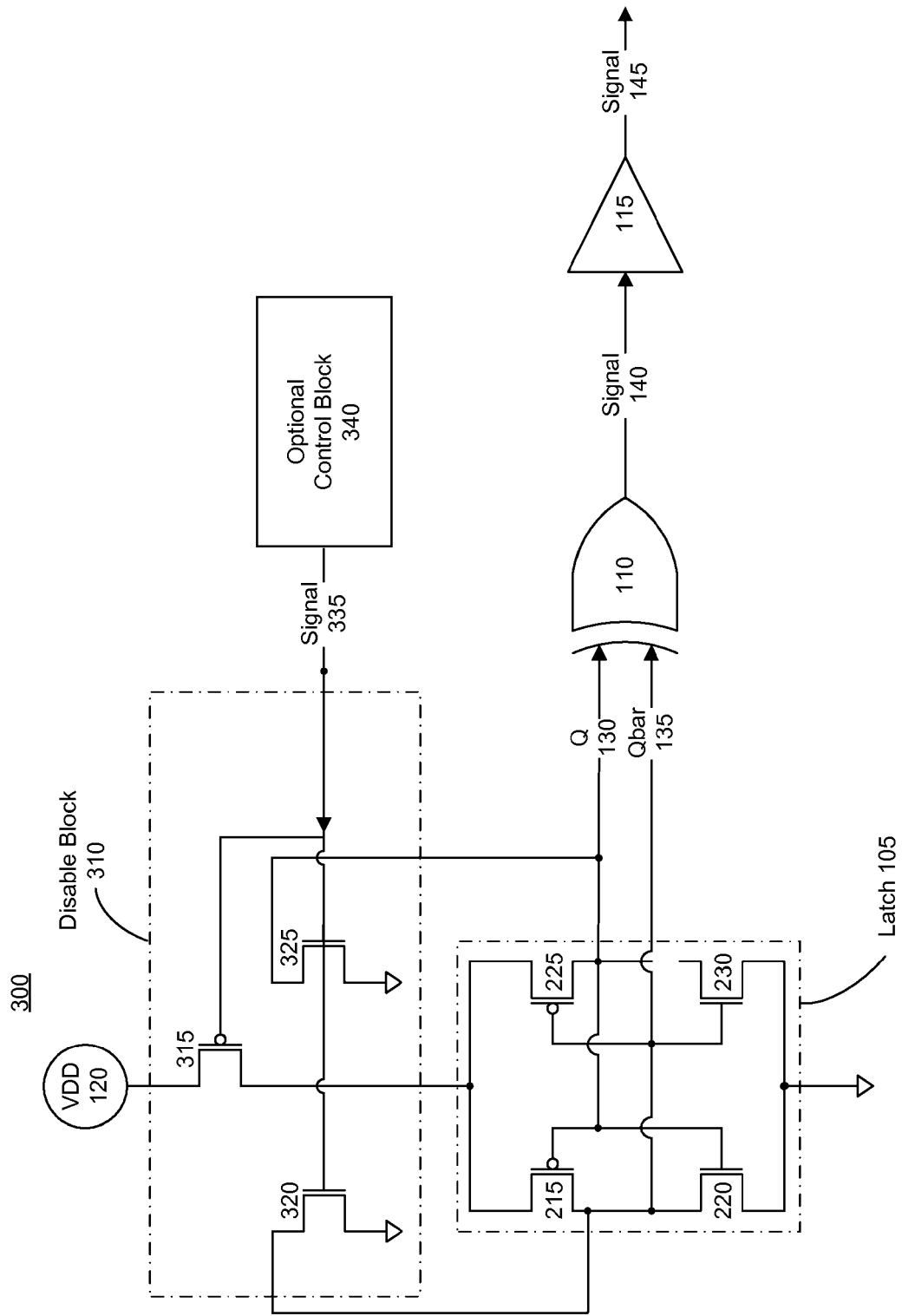
FIG. 3 is a third schematic diagram illustrating a power-on monitoring system in accordance with another embodiment of the present invention.

FIG. 3 is a third schematic diagram illustrating a power-on monitoring system (system) 300 in accordance with another embodiment of the present invention. FIG. 3 illustrates an embodiment of the power-on detection system 100 described with reference to FIGS. 1 and 2. System 300 can monitor for interruptions, or decreases in a voltage potential, of a power supply providing power to a circuit block separate, and distinct, from system 300 that can render the circuit block inoperable. System 300 can include latch 105, exclusive OR 110, driver 115, and disable block 310.

Latch 105, exclusive OR 110, and driver 115 are implemented, and operate, largely as described within this specification with reference to FIGS. 1 and 2. Disable block 310 can include PMOS device (PMOS) 315, NMOS device (NMOS) 320, and NMOS device 325. Disable block 310 can receive signal 335 as input to control the functionality of disable block 310. More particularly, disable block 310 can disable and power down latch 105. Disable block 310 can decouple latch 105 from power supply VDD 120. In addition, disable block 310 can couple the output nodes of latch 105 to ground in order to discharge internal nodes of latch 105 to a power down state.

As previously described within this specification, a feedback loop within latch 105 assures that latch 105 remains resolved even when the voltage potential of VDD 120 decreases to a value less than the minimum voltage necessary to resolve latch 105 during start-up. For this reason, once resolved, latch 105 cannot be used to detect a temporary loss of, or reduced voltage potential provided by, VDD 120. For example, during a period of reduced voltage potential of VDD 120, e.g., a "brown out," the positive feedback loop within latch 105 ensures that latch 105 stays in the resolved state despite the voltage potential of VDD 120 decreasing below the minimum voltage potential necessary to resolve latch 105.

In order to monitor whether the voltage potential of VDD 120 is a constant voltage potential sufficient for a circuit block being monitored by system 300 to continue to operate, latch 105 must periodically be disconnected from VDD 120. In addition, the nodes internal to latch 105 can be discharged to a power down state. Once discharged, latch 105 can be re-coupled to VDD 120 and used to determine whether the voltage potential of VDD 120 is sufficient to resolve latch 105 in a same manner as previously described within this specification. Performing the process of periodically disabling latch 105 allows system 300 to be used as a continuous monitor of VDD 120 and, accordingly, the power-on state of a circuit block monitored by system 300.

In operation, system 300 can begin with start-up of the IC containing system 300 completed, and latch 105 in a resolved state. With latch 105 in the resolved state, the voltage potentials of signals Q 130 and Qbar 135 each is driven to opposing logic levels. At a time subsequent to start-up, signal 335 can transition to a logic high and disable block 310 can become operable. Signal 335 can be generated within optional control block 340. Control block 340 can determine the frequency with which, and period of time, signal 335 is at a logic high and, accordingly, when disable block 310 is operable. Control block 340 can be implemented within system 300, contained within a functional circuit block other than system 300 within the IC, a combination of circuit blocks both internal and external to system 300 within the IC, or a combination of circuit blocks external to the IC.

In one embodiment, control block 340 can be implemented as a controller. The capabilities of the controller can be leveraged to generate signal 335 for disable block 310. Additionally, the processor can utilize additional power-on indicators beyond the resolving of latch 105 within more complex algorithms that determine whether the circuit monitored by system 300 is in a power-on state. In one embodiment, the controller can execute program code that determines parameters of signal 335. For example, the controller can be implemented as a processor, whether a hard processor or a soft processor formed from the programmable circuitry of a programmable IC. In another embodiment, the controller can be implemented via circuitry, whether or not programmable circuitry, (without executing program code) to control signal 335. The characteristics of signal 335, as generated by the controller, for example, can be user programmable through software or parameters of a hardware descriptive language (HDL) that are compiled to implement control block 340.

In another embodiment control block 340 can be implemented using timing circuitry. For example, control block 340 can provide signal 335 as a control signal with a fixed frequency and duty cycle. Alternatively, control block 340 can implement a more complex algorithm that determines when disable block 310 is to be operable or inoperable. In one embodiment, control block 340 can be contained within system 300 and include an oscillator (not shown) and a counter (not shown). The counter can be programmed to generate signal 335, from the output signal of the oscillator, as a clock signal with a predetermined frequency and duty cycle. The predetermined frequency and duty cycle can be fixed. Alternatively, the predetermined frequency and duty cycle of signal 335 can be adjustable, thereby providing adaptability of system 300 to differing power-on monitoring requirements and implementations.

Referring to FIG. 3, when signal 335 is at a logic high, PMOS 315 is disabled and NMOS 320 and NMOS 325 are enabled. As a source terminal of PMOS 315 is coupled to VDD 120 and a drain terminal of PMOS 315 is coupled to latch 105, disabling PMOS 315 decouples latch 105 from VDD 120. Although latch 105 is decoupled from VDD 120 by PMOS 315, the high impedances seen at the outputs of the cross-coupled inverters within latch 105 and the effect of the positive feedback loop within latch 105 may prevent signals Q 130 and Qbar 135 from discharging to ground subsequent to the enabling of PMOS 315. With the voltage potential of signals Q 130 and Qbar 135 undetermined, latch 105 may enter a power down state. Proper operation of system 300, however, requires latch 105 to resolve from a power down state.

In order to assure that latch 105 enters a power down state, NMOS 320 and NMOS 325 can be enabled by signal 335. As a source terminal of each of NMOS 320 and NMOS 325 is coupled to ground and a drain terminal of each of NMOS 320 and NMOS 325 is coupled to an output of latch 105, when enabled, each of NMOS 320 and NMOS 325 can couple an output node of latch 105 to ground. Coupling the output nodes of latch 105 to ground can discharge the output nodes, thereby assuring that each of signals Q 130 and Qbar 135 is at a logic low. Accordingly, latch 105 can be forced to a power down state. In addition, disconnecting latch 105 from VDD 120 using PMOS 315 and coupling the output nodes of latch 105 to ground via NMOS 320 and NMOS 325 prevents the creation of an open current path from VDD 120 to ground within disable block 310 or latch 105. Preventing an open current path from VDD 120 to ground can prevent static power consumption by either disable block 310 or latch 105 when signal 335 remains at a logic high.

The circuit architecture illustrated for disable block 310 in FIG. 3 is for illustrative purposes only and, as such, is not intended as a limitation of the embodiments disclosed herein. It should be noted that implementing disable block 310 with a circuit architecture that requires no static current consumption retains the low power advantage of system 300 over conventional power-on monitoring circuits.

With latch 105 in a power down state, signal 335 can transition to a logic low. The period of time signal 335 remains at a logic high, and disable block 310 is operable, can be influenced by a variety of performance and process factors. For example, signal 335 may be required to remain high for a minimum period of time to assure that latch 105 is forced into a power down state. In another example, signal 335 can remain high in order to prevent the resolution of latch 105 prior to a desired time. The transition of signal 335 to a logic low, renders disable block 310 inoperable, thereby re-coupling VDD 120 to latch 105 and releasing latch 105 to begin start-up.

With VDD 120 coupled to latch 105, system 300 can precede from power down through the power-on detection process described within this specification with reference to FIGS. 1 and 2. By periodically repeating the cycle of powering down latch 105, subsequently re-coupling latch 105 to VDD 120, and releasing latch 105 to attempt to resolve, system 300 can provide continuous monitoring for power-on of a circuit block. Additionally, unlike conventional power-on circuits, system 300 can provide continuous power-on monitoring without static power consumption. The lack of static power consumption by system 300 is useful in IC designs with low power consumption requirements. The need for low power consumption ICs can be found in laptop computers, mobile communication devices, such as, cellular mobile telephones, digital cameras, calculators, and the like.

As noted, any circuit block that communicates with the monitored circuit block can receive signal 145. When signal 145 indicates that the monitored circuit is not in a power-on state, the circuit block in communication with the monitored circuit block can discontinue communication with the monitored circuit block until such time that the monitored circuit block again enters the power-on state as indicated by signal 145.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A system for detecting power-on of a circuit block within an integrated circuit (IC), the system comprising:
    a latch comprising a latch output and an inverted latch output, wherein the latch is coupled to, and powered by, a power supply providing power to the circuit block within the IC; and
    an exclusive OR circuit comprising an input stage coupled to the latch output and the inverted latch output, wherein the exclusive OR circuit generates an output signal indicating whether the circuit block is in a power-on state.

2. The system of claim 1, wherein the exclusive OR circuit generates an output signal indicating that the circuit block is not in the power-on state when the latch is not resolved to a stable state and generates an output signal indicating that the circuit block is in the power-on state when latch resolves to a stable state.

3. The system of claim 1, wherein a minimum voltage potential provided by the power supply causes the latch to resolve to a stable state and also causes the circuit block to enter the power-on state.

4. The system of claim 1, further comprising a driver comprising an input coupled to the output of the exclusive OR circuit and an output capable of driving a load impedance coupled to the driver output.

5. The system of claim 1, wherein the latch comprises a static memory cell comprising a first inverter and a second inverter, wherein the first and second inverters are cross-coupled.

6. The system of claim 5, wherein the first and second inverters each comprises a complimentary metal oxide semiconductor (CMOS) inverter, wherein a pull-up device of each inverter is implemented as a P-type metal oxide semiconductor (PMOS) device and a pull-down device of each inverter is implemented as an N-type metal oxide semiconductor (NMOS) device.

7. The system of claim 1, wherein each of the latch and the input stage of the exclusive OR circuit comprises at least one complimentary metal oxide semiconductor (CMOS) device, wherein the CMOS device within the input stage of the exclusive OR circuit has a lower threshold voltage than the CMOS device within the latch.

8. A system for detecting power-on of a circuit block within an IC, the system comprising:
   a static memory cell comprising a first inverter and a second inverter that are cross-coupled, wherein an output of the first inverter comprises a memory cell output and an output of the second inverter comprises an inverted memory cell output, and wherein the memory cell is coupled to, and powered by, a power supply provided to the circuit block within the IC; and
   an exclusive OR circuit comprising an input stage coupled to the memory cell output and the inverted memory cell output, wherein the exclusive OR circuit generates an output signal indicating whether the circuit block has achieved a power-on state.

9. The system of claim 8, wherein the exclusive OR circuit generates an output signal indicating that the circuit block is not in the power-on state when the static memory cell is not resolved to a stable state and generates an output signal indicating the circuit block is in the power-on state when the static memory cell resolves to a stable state.

10. The system of claim 8, wherein a minimum voltage potential provided by the power supply causes the static memory cell to resolve to a stable state and also causes the circuit block to enter the power-on state.

11. The system of claim 8, further comprising a driver comprising an input coupled to the exclusive OR circuit output and an output capable of driving a load impedance coupled to the driver output.

12. The system of claim 8, wherein the first and second inverters each comprises a complimentary metal oxide semiconductor (CMOS) inverter, wherein a pull-up device of each inverter is implemented as a P-type metal oxide semiconductor (PMOS) device and a pull-down device of each inverter is implemented as an N-type metal oxide semiconductor (NMOS) device.

13. The system of claim 8, wherein each of the static memory cell and the input stage of the exclusive OR circuit comprises at least one complimentary metal oxide semiconductor (CMOS) device, wherein the CMOS device within the input stage of the exclusive OR circuit has a lower threshold voltage than the CMOS device within the static memory cell.

14. A system for monitoring for a power-on state within a circuit block within an IC, the system comprising:
   a static memory cell comprising a first inverter and a second inverter that are cross-coupled, wherein an output of the first inverter comprises a memory cell output and an output of the second inverter comprises an inverted memory cell output, and wherein the memory cell is selectively coupled to, and powered by, a power supply provided to the circuit block within the IC;
   a disabling block, coupled to, and between, the static memory cell and the power supply, comprising an input that receives a control signal, the disabling block selectively coupling the static memory cell to the power supply causing the static memory cell to enter a power down state or begin start-up responsive to the control signal; and
   an exclusive OR circuit comprising an input stage coupled to the memory cell output and the inverted memory cell output, wherein the exclusive OR circuit generates an output signal indicating whether the circuit block is in a power-on state.

15. The system of claim 14, wherein the exclusive OR circuit generates an output signal indicating that the circuit block is not in the power-on state when the static memory cell is not resolved to a stable state and generates an output signal indicating the circuit block is in the power-on state when the static memory cell resolves to a stable state.

16. The system of claim 14, wherein a minimum voltage potential provided by the power supply causes the static memory cell to resolve to a stable state and also causes the circuit block to enter the power-on state.

17. The system of claim 14, wherein the first and second inverters each comprises a CMOS inverter, wherein a pull-up device of each inverter is implemented as a PMOS device and a pull-down device of each inverter is implemented as an NMOS device.

18. The system of claim 14, wherein the disabling block, responsive to the control signal, forces the static memory cell to the power down state by decoupling the static memory cell from the power supply and coupling the static memory cell output and the inverted static memory cell output to a lowest voltage potential of the power supply, and wherein the disabling block, responsive to the control signal, causes the static memory cell to begin startup by coupling the static memory cell to the power supply and decoupling the memory cell output and the inverted memory cell output from the lowest voltage potential of the power supply.

19. The system of claim 14, wherein the disabling block further comprises:
   a first metal oxide field effect transistor (MOSFET) switch, wherein a drain terminal of the first MOSFET switch is coupled to the memory cell output, a source terminal of the first MOSFET switch is coupled to a first voltage potential provided by the power supply, and a gate terminal of the first MOSFET switch is coupled to the control signal;
   a second MOSFET switch, wherein a drain terminal of the second MOSFET switch is coupled to the inverted memory cell output, a source terminal of the second MOSFET switch is coupled to a first voltage potential provided by the power supply, and a gate terminal of the second MOSFET switch is coupled to the control signal; and
   a third MOSFET switch, wherein a drain terminal of the third MOSFET switch is coupled to a source terminal of each of a PMOS device within the first and second inverters, a source terminal of the third MOSFET switch is coupled to a second voltage potential provided by the power supply, and a gate terminal of the third MOSFET switch is coupled to the control signal.

20. The system of claim 14, wherein each of the static memory cell and the input stage of the exclusive OR circuit comprises at least one complimentary metal oxide semiconductor (CMOS) device, wherein the CMOS device within the input stage of the exclusive OR circuit has a lower threshold voltage than the CMOS device within the static memory cell.

* * * * *